(12) United States Patent
Divakaruni et al.

(10) Patent No.: US 6,864,540 B1
(45) Date of Patent: Mar. 8, 2005

(54) HIGH PERFORMANCE FET WITH ELEVATED SOURCE/DRAIN REGION

(75) Inventors: Rama Divakaruni, Ossing, NY (US); Louis C. Hsu, Fishkill, NY (US); Rajiv V. Joshi, Yorktown Heights, NY (US); Carl J. Radens, LaGrangeville, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/851,530

(22) Filed: May 21, 2004

(51) Int. Cl.⁷ ............................................. H01L 29/76
(52) U.S. Cl. ..................... 257/368; 257/336; 257/347; 257/352; 257/368; 257/369; 257/371; 257/382; 257/374; 257/412; 438/139; 438/183; 438/327; 438/149; 438/479; 438/517
(58) Field of Search ............................... 257/336, 347, 257/352, 368, 369, 371, 382, 374, 412; 438/139, 183, 327, 149, 479, 517

(56) References Cited

U.S. PATENT DOCUMENTS

| | | | |
|---|---|---|---|
| 4,830,975 A | | 5/1989 | Bovaird et al. |
| 5,418,391 A | * | 5/1995 | Huang .......................... 257/336 |
| 5,485,028 A | * | 1/1996 | Takahashi et al. ........... 257/347 |
| 6,060,749 A | | 5/2000 | Wu |
| 6,395,589 B1 | | 5/2002 | Yu |
| 6,506,649 B2 | | 1/2003 | Fung et al. |
| 6,537,861 B1 | * | 3/2003 | Kroell et al. ................ 438/149 |
| 6,653,700 B2 | * | 11/2003 | Chau et al. .................. 257/412 |
| 6,716,682 B1 | * | 4/2004 | Mouli .......................... 438/149 |
| 6,747,314 B2 | * | 6/2004 | Sundaresan et al. ......... 257/330 |
| 6,759,712 B2 | * | 7/2004 | Bhattacharyya .............. 257/347 |
| 2004/0051140 A1 | * | 3/2004 | Bhattcharyya ............... 257/347 |
| 2004/0155317 A1 | * | 8/2004 | Bhattacharyya ............. 257/616 |

* cited by examiner

Primary Examiner—Matthew Smith
Assistant Examiner—Belur Keshavan
(74) Attorney, Agent, or Firm—Law Office of Charles W. Peterson, Jr.; Louis J. Percello

(57) ABSTRACT

The invention includes a field effect transistor (FET) on an insulator layer, and integrated circuit (IC) on SOI chip including the FETs and a method of forming the IC. The FETs include a thin channel with raised source/drain (RSD) regions at each end on an insulator layer, e.g., on an ultra-thin silicon on insulator (SOI) chip. Isolation trenches at each end of the FETs, i.e., at the end of the RSD regions, isolate and define FET islands. Insulating sidewalls at each RSD region sandwich the FET gate between the RSD regions. The gate dielectric may be a high K dielectric. Salicide on the RSD regions and, optionally, on the gates reduce device resistances.

26 Claims, 8 Drawing Sheets

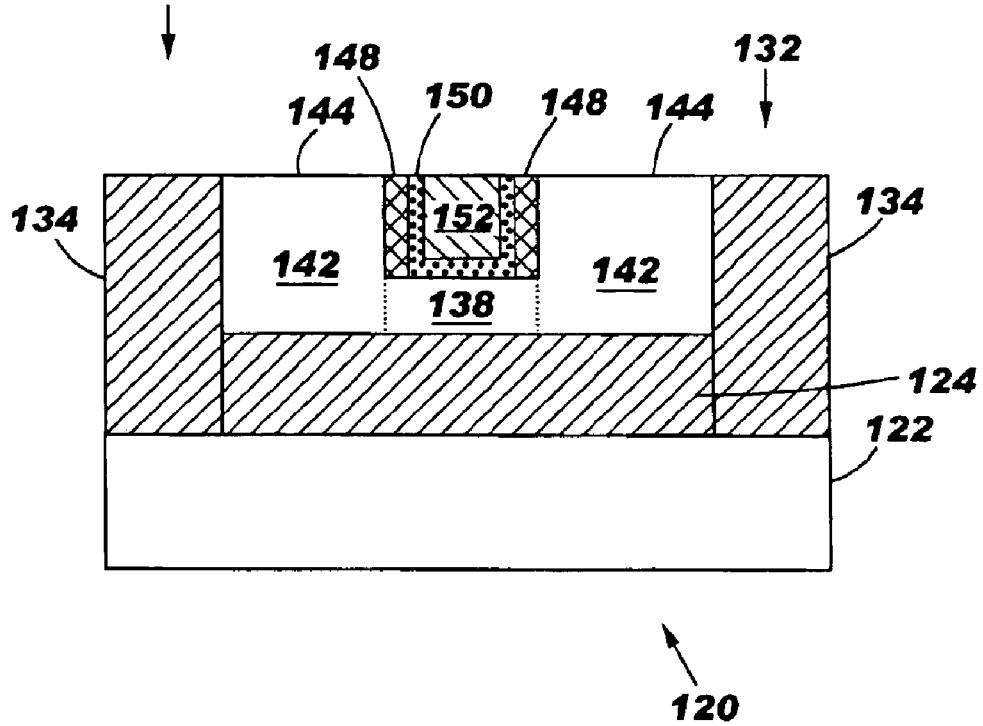

HIGH PERFORMANCE FET WITH ELEVATED SOURCE/DRAIN REGION

BACKGROUND OF THE INVENTION

1. Field of the Invention

The present invention is related to semiconductor devices and more particularly to high performance field effect transistors (FETs) and methods of manufacturing high performance FETs.

2. Background Description

Typical semiconductor integrated circuit (IC) design goals include high performance (circuit switching frequency) and density (transistors per unit area) at minimum circuit power. Semiconductor technology and chip manufacturing advances have continually reduced circuit feature dimensions and, correspondingly, supply voltage to pack more function in the same area. To minimize power, many ICs are made in the well-known complementary insulated gate field effect transistor (FET) technology known as CMOS.

A typical CMOS circuit drives a purely or nearly pure capacitive load and includes paired complementary devices, i.e., an n-type FET (NFET) paired with a corresponding p-type FET (PFET), usually gated by the same signal. A CMOS inverter, for example, is a PFET and NFET pair that are series connected between a power supply voltage ($V_{dd}$) and ground (GND), and both gated by the same input signal. Since the pair of devices have operating characteristics that are, essentially, opposite each other, when one device (e.g., the NFET) is on and conducting (modeled simply as a closed switch), the other device (the PFET) is off, not conducting (ideally modeled as a simple open switch) and, vice versa. The switch is open, i.e., the device is off, when the magnitude of the gate to source voltage ($V_{gs}$) is less than that of some threshold voltage ($V_T$). So, ideally, an NFET is off when its $V_{gs}$ is below $V_T$, and the NFET is on and conducting current above $V_T$. Similarly, a PFET is off when its gate voltage, $V_{gs}$, is above its $V_T$, i.e., less negative, and on below $V_T$.

Since NFETs and PFETs are not ideal, FETs have inherent device resistance, including parasitic resistances, which may be modeled as a resistor in series with the switch. Performance depends upon how fast the CMOS circuit can charge and discharge the capacitive load, i.e., the circuit's switching speed. Device resistances limit current supplied by a particular device and slow capacitive switching. So, how fast the circuit switches the particular load switches depends both upon device on-current (which is selected by design) and these device resistances. Thus, circuit performance is maximized by maximizing device on-current and minimizing unwanted device resistance.

Another design concern is that, as FET features have shrunk, what are collectively known as short channel effects have become pronounced, resulting in a rapid increase of static power consumption. Short channel effects have occurred, in part, from a VT reduction as the FET gate length is reduced. Such $V_T$ dependence on gate length, also known as $V_T$ roll-off, which has been mitigated by thinning the transistor gate insulator. Unfortunately, especially as FET features have shrunk, thinner gate insulator (e.g., silicon oxide ($SiO_2$) or a high-K dielectric) has resulted in increased gate leakages or gate induced leakages (i.e., gate to channel, gate to source or drain and gate induced drain leakage (GIDL)). Therefore, for circuits with transistor gate lengths shorter than 100 nm, the circuit stand-by power has become comparable to the active power.

However, short channel effects are know to improve inversely with channel thickness. So for silicon on insulator (SOI), sub-threshold leakage and other short channel effects have been controlled and reduced by thinning the surface silicon layer, i.e., the device channel layer. Fully depleted (FD) devices have been formed in what is commonly referred to as ultra-thin SOI, where the silicon channel layer is less than 50 nm. Ultra-thin FD SOI devices operate at lower effective voltage fields and constitute the leading candidate to continue scaling gate to deep sub 40 nm and beyond. Additionally, these ultra-thin SOI layers can be doped for higher mobility, which in turn increases device current and improves circuit performance. Also, ultra-thin FD SOI devices have a steeper sub-threshold current swing with current falling off sharply as $V_{gs}$ drops below $V_T$.

Unfortunately, however, forming source/drain regions that are made from the same ultra-thin silicon layer increases external resistance and in particular contact resistance. Similar high resistance source/drain diffusion and contact problems have been encountered in bulk silicon CMOS with lightly doped drain (LDD) devices, where the source/drain regions are maintained very shallow for lower voltage operation. Silicide has been tried to reduce this external resistance but has not been problem free. Especially for these very short devices, unless the source/drain silicide is spaced away from the gate, the silicide can cause gate to channel or source/drain shorts, for example. Also, silicide can interfere/interact with high-K gate dielectric formation and vice versa.

Another approach that has been used to reduce this external resistance is to selectively thicken the surface silicon layer adjacent device gates, e.g., using selective epitaxial silicon growth, to produce raised source and drain (RSD) regions. The thicker silicon RSD regions have a larger cross-sectional area for lower resistance per unit area (sheet resistance) and so, are effective in overcoming the external resistance problem. However, thickening the silicon layer to form RSD regions has also suffered from inadequate isolation and so, has suffered from an increase in source to drain shorts.

Thus, there is a need to reduce external resistance for ultra-thin SOI devices and while minimizing device on resistance.

SUMMARY OF THE INVENTION

It is a purpose of the invention to improve field effect transistor (FET) performance;

It is another purpose of the invention to reduce ultra-thin channel FET series resistance.

The present invention relates to a field effect transistor (FET), integrated circuit (IC) chip including the FETs and a method of forming the FETs. The FETs include a thin channel with raised source/drain (RSD) regions at each end on an insulator layer, e.g., on an ultra-thin silicon on insulator (SOI) chip. Isolation trenches at each end of the FETs, i.e., at the end of the RSD regions, isolate and define FET islands. Insulating sidewalls at each RSD region sandwich the FET gate between the RSD regions. The gate dielectric may be a high K dielectric. Salicide on the RSD regions and, optionally, on the gates reduce device resistances.

BRIEF DESCRIPTION OF THE DRAWINGS

The foregoing and other objects, aspects and advantages will be better understood from the following detailed description of a preferred embodiment of the invention with reference to the drawings, in which:

FIGS. 5A–E show an example of gate formation step;

DESCRIPTION OF PREFERRED EMBODIMENTS

Figure 1:
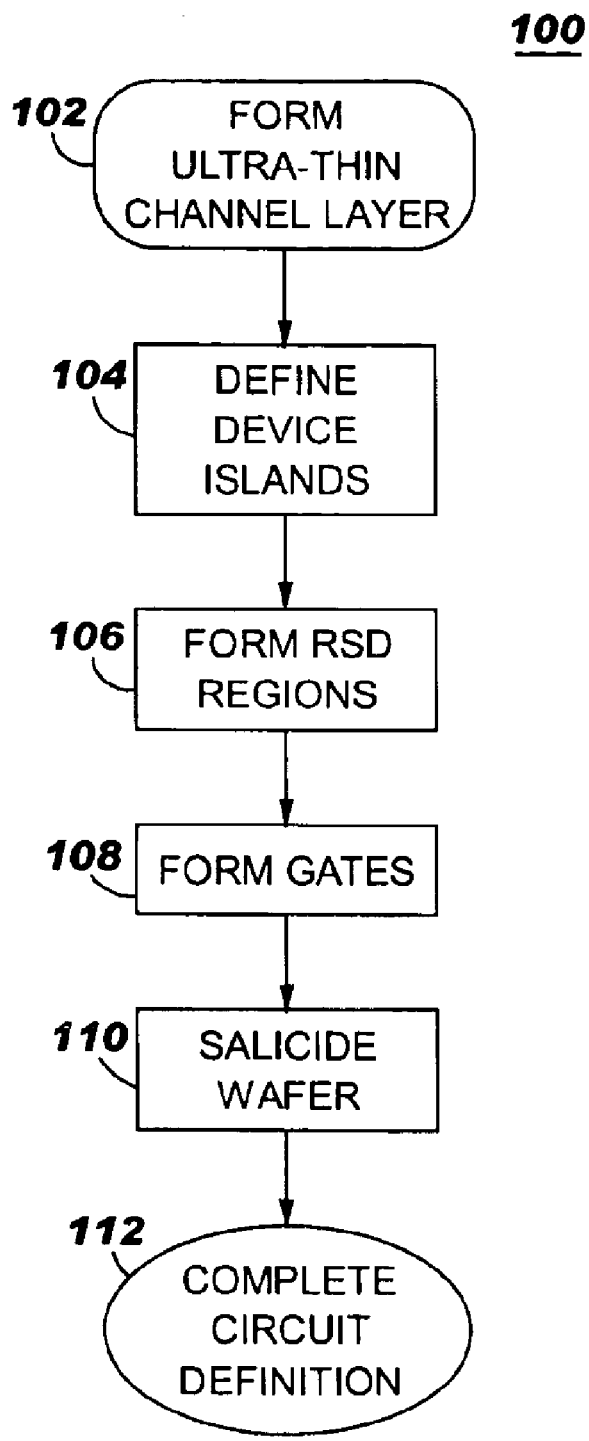
FIG. 1 shows an example of steps for forming field effect transistors (FETs) with raised source/drain (RSD) regions according to a preferred embodiment of the present invention.

Turning now to the drawings and, more particularly, FIG. 1 shows a flow diagram example 100 for forming field effect transistors (FETs) with raised source/drain (RSD) regions according to a preferred embodiment of the present invention. First, in step 102 a layered semiconductor (e.g., silicon) on insulator (SOI) wafer is provided with an ultra-thin semiconductor surface layer. Next, in step 104 device islands are formed from the ultra-thin semiconductor surface layer, e.g., using shallow trench isolation (STI). Then, in step 106 source/drain regions are thickened on the islands. In step 108 damascene replacement gates are formed between and using the RSD regions as a stopping layer, which competes individual device structure at each device island. For a typical CMOS SOI chip, steps 104, 106 and 108 can each be performed for one type device followed by the second (e.g., P-type followed by N-type or vice versa) or each of steps 104, 106 and 108 may be performed for the one type, immediately followed by the same step 104, 106 or 108 for the second type. In step 110 a silicide layer is formed on the wafer and patterned to form low resistance device terminals, preferably, using a self aligned silicide (salicide). Finally, in step 112 device processing continues through typical semiconductor manufacturing middle of the line (MOL) and back end of the line (BEOL) processing steps to form integrated circuit (IC) chips.

Figure 2:
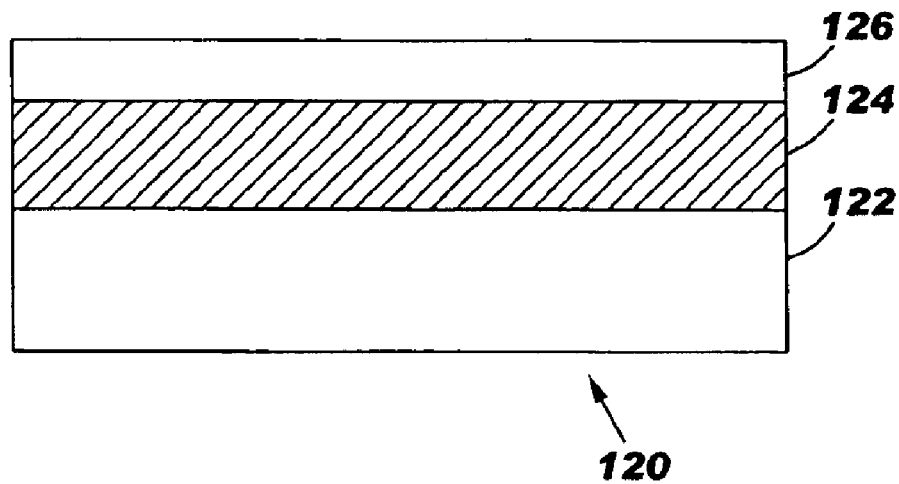
FIG. 2 shows an example of a preferred layered ultra-thin semiconductor (e.g., silicon) on insulator (SOI) wafer.

FIG. 2 shows a cross sectional example of a preferred ultra-thin SOI wafer 120 provided in step 102 of FIG. 1. A typical substrate layer 122, e.g., silicon, supports an insulator layer 124 and an ultra-thin surface or device layer 126, e.g., silicon. The insulator layer 124 is 20 to 1000 nanometers (nm) thick and, preferably, 100 nm thick and may be a buried oxide (BOX) layer of a suitable material (e.g., silicon oxide ($SiO_2$) or sapphire) formed, for example, implanting oxide into a silicon wafer. The ultra-thin surface device layer 126 is 5 to 200 nm thick and preferably 30 nm thick.

Figure 3:
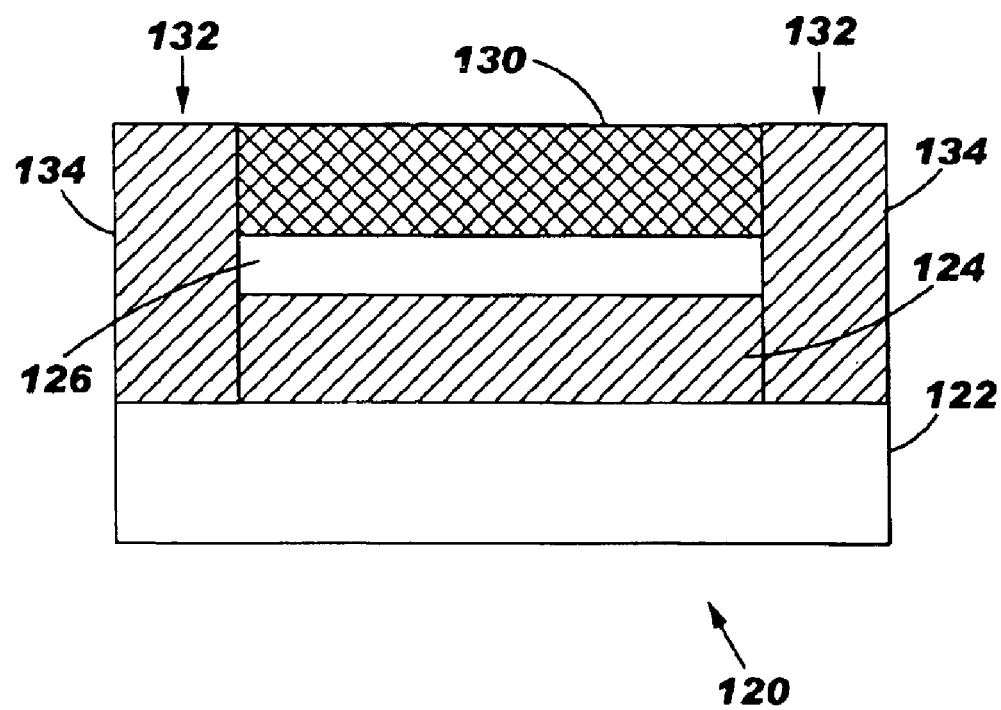
FIG. 3 shows an example of a device island formed from the ultra-thin surface layer.

FIG. 3 shows an example of a device island 128 formed in step 104 from the ultra-thin device layer 126 of the cross sectional example of FIG. 2. First, a pad layer 130, preferably of silicon nitride (SiN) is formed on the wafer 120, 20 to 200 nm and preferably 50 nm. Device islands 128 are defined using any suitable well known photolithographic technique with a suitable etchant or etchants, e.g., a reactive ion etch (RIE). Shallow trenches 132 are etched through the pad-layer 130 and the ultra-thin layer at least to the insulator layer 124, which defines device islands 128. The trenches 132 are spaced apart at a distance to allow formation of source/drain contacts at either end of the device formed on the device island 128, e.g., 250 nm. After removing photolithographic pattern material or photoresist (not shown), the shallow trenches 132 are filled with suitable insulating material. After the trenches 132 are filled, e.g., using an oxide deposition, the wafer is planarized to the pad layer 130 using, for example, a suitable chemical mechanical polish (CMP), which leaves shallow trench isolation (STI) plugs 134 filling trenches 132. Although STI plugs 134 are shown herein as separate from BOX layer 124, it is understood that whenever STI plugs 134 are of the same material as BOX layer 124 there is no discernable boundary between the two, i.e., STI plugs 134 merge with and form with BOX layer 124.

Figure 4A:
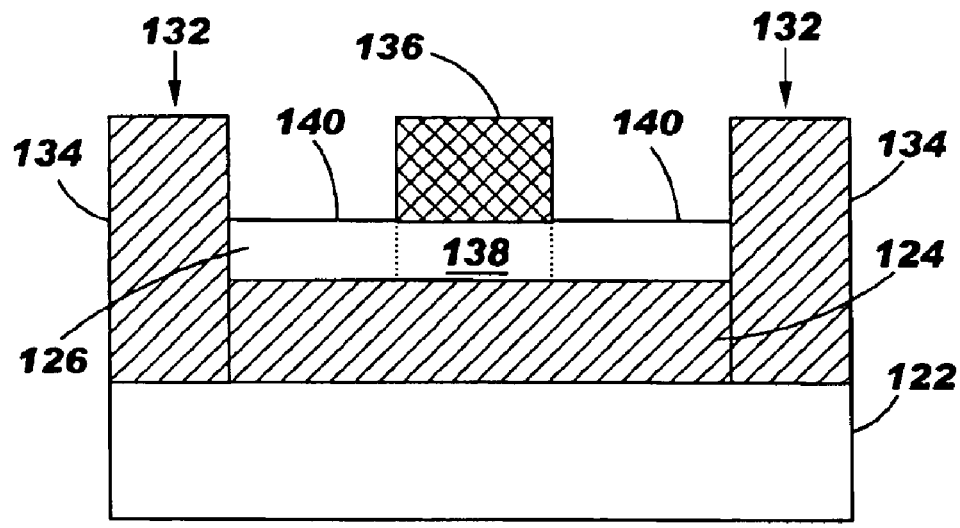
FIGS. 4A–C show examples of the step of forming RSD regions.
Figure 4B:
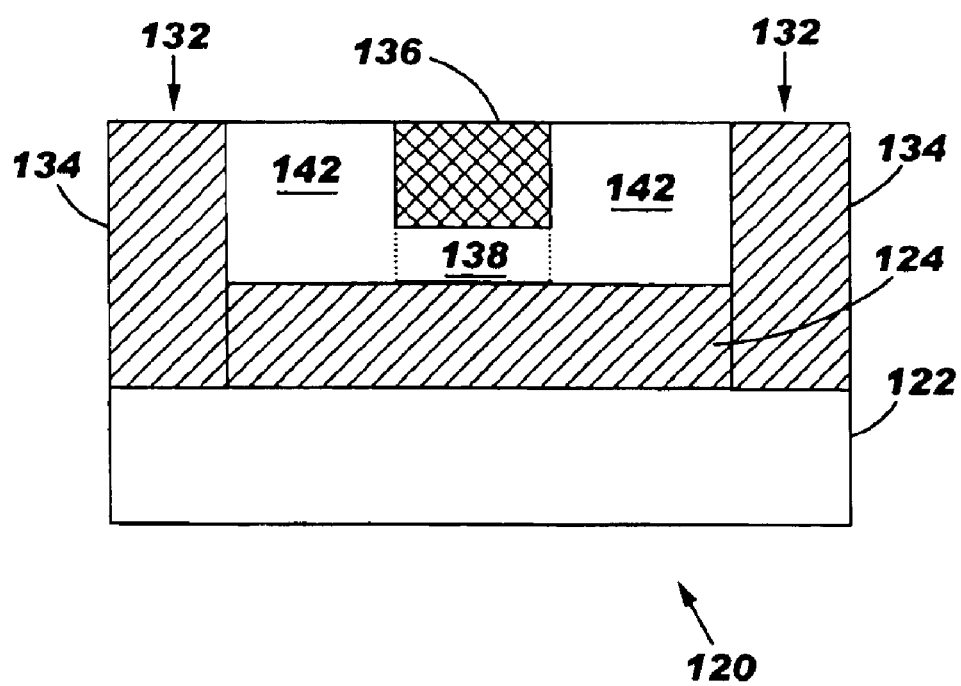
Figure 4C:
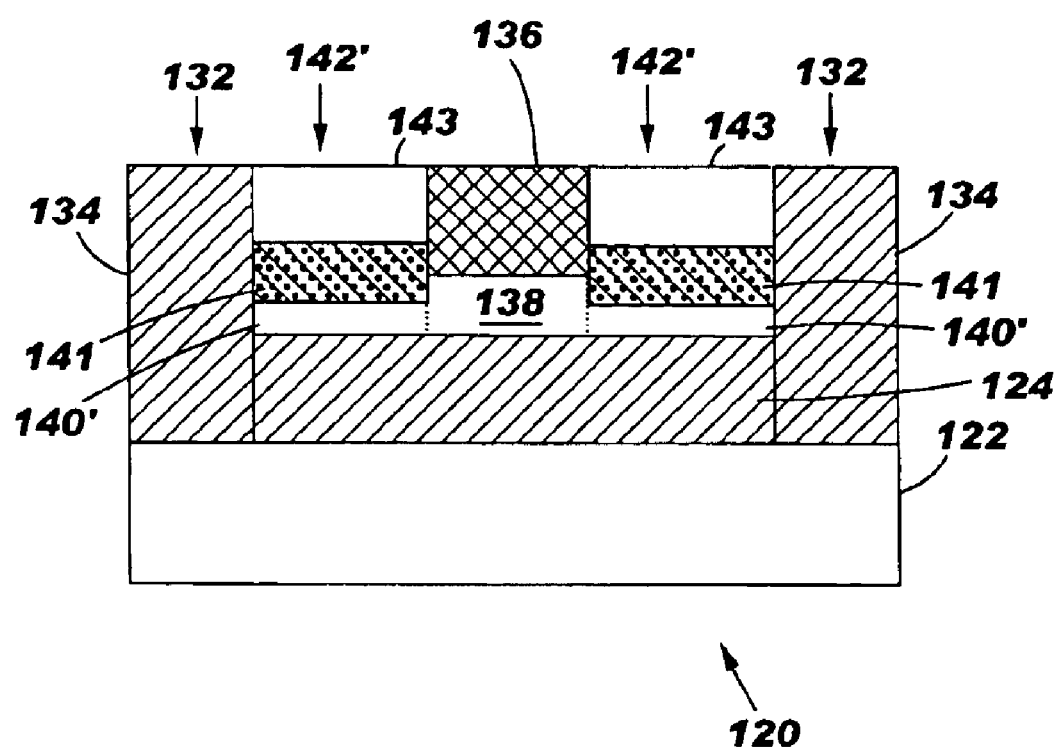

FIGS. 4A–C show cross-sectional examples of the step 106 of forming RSD regions. First, as can be seen from FIG. 4A, the remaining portion of pad layer 130: in FIG. 3 is patterned to define a mandrel placeholder 136 that defines the device channel 138 between source/drain areas 140. For example a using typical photolithographic patterning techniques, a mask is formed on the pad layer. Then, exposed portions of the pad layer are etched to the ultra-thin device layer with an etchant selective to the pad, e.g., anisotropic plasma or RIE, while leaving the STI plugs 134 essentially unetched. Then, exposed source/drain areas 140 are doped with a suitable dopant for the particular device type, e.g., implanted with P-type or N-type dopant and with the mandrel placeholder 136 masking underlying channel 138. Then, in FIG. 4B the ultra-thin device layer at source/drain areas 140 is selectively thickened, e.g., by epitaxially growing semiconductor material on the source/drain areas 140, preferably, in situ doped silicon. Thereafter, the thickened source/drain areas are planarized, e.g., with CMP, stopping on the STI plugs 134 and at the mandrel placeholder 136 to complete RSD region 142 definition. Also, during RSD formation, dopant diffuses slightly under the mandrel placeholder 136, providing sufficient overlap for a subsequently formed gate. Optionally, as shown in the example of FIG. 4C the RSD regions 142' may be a composite semiconductor including one or more pseudomorphic or strained silicon germanium (SiGe) layers 141. In this example, the device layer surface is etched slightly in the source drain areas 140', the pseudomorphic or strained silicon germanium (SiGe) layer(s) 141 are formed, e.g., deposited, and a silicon layer 143 is formed on the pseudomorphic or strained silicon germanium (SiGe) layer(s) 141.

Figure 5A:
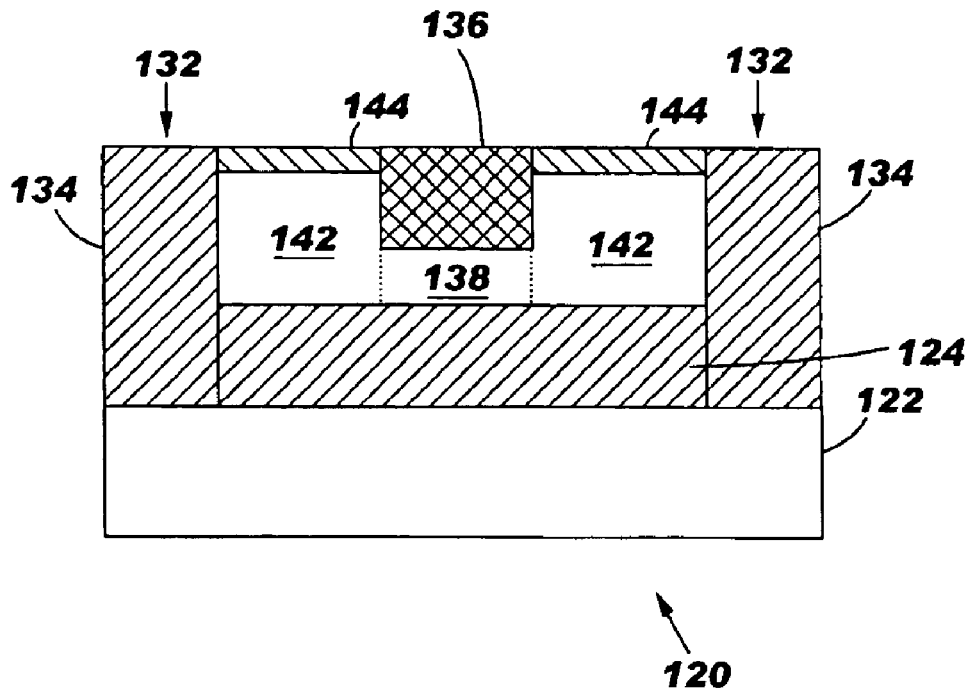
Figure 5B:
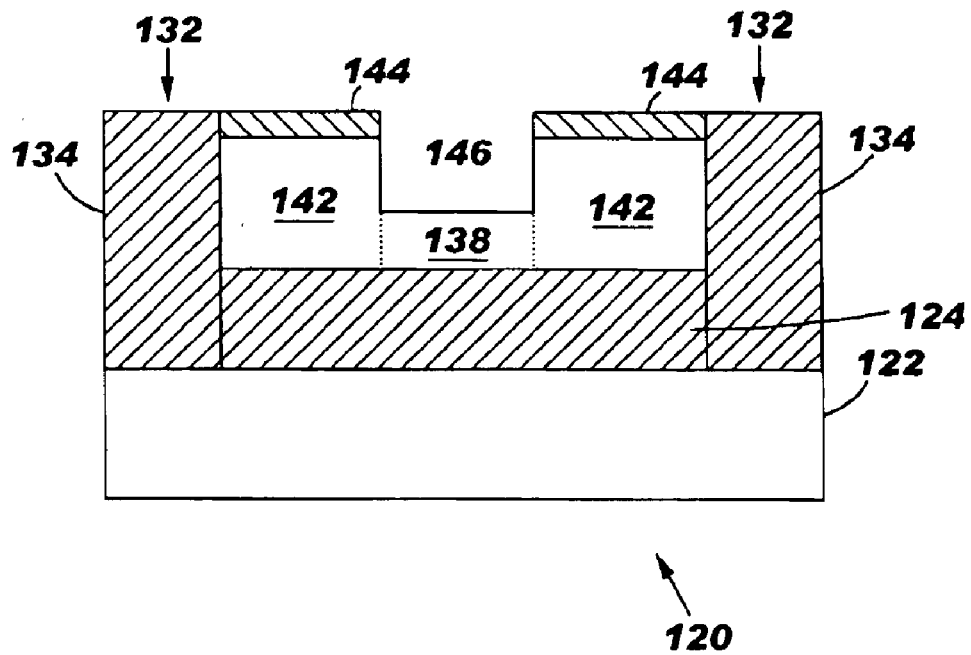
Figure 5C:
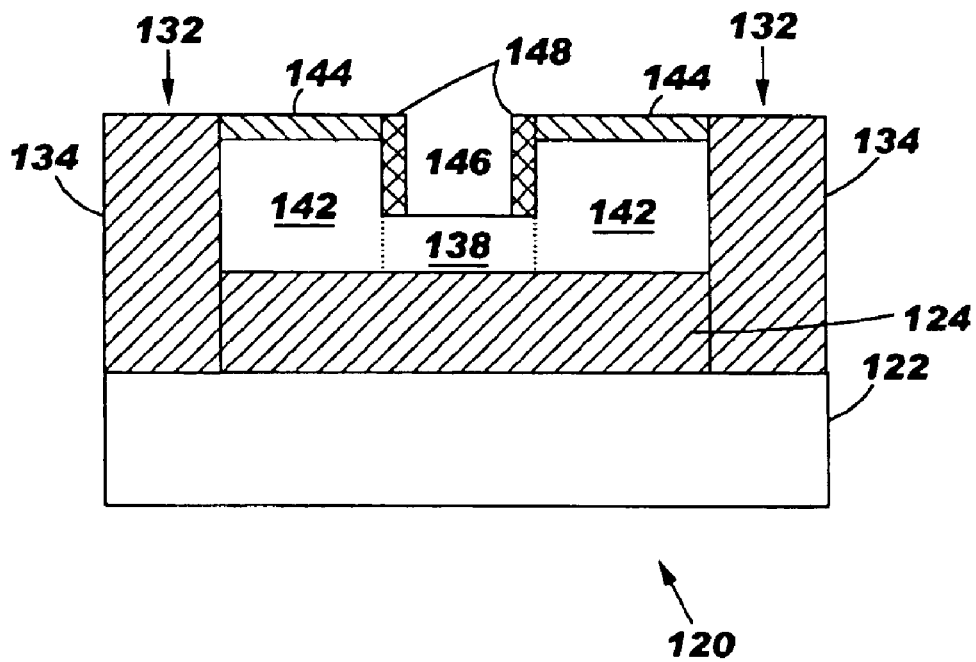
Figure 5D:
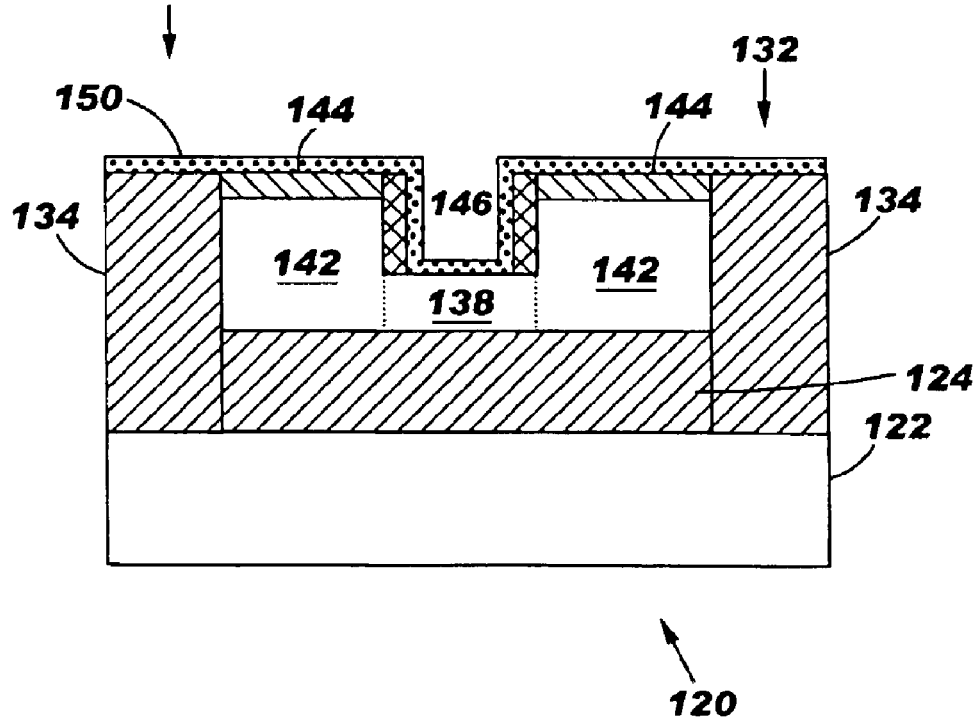

FIGS. 5A–E show an example of gate formation step 108 of FIG. 1 on the cross sectional example of FIG. 4B. First, as shown in FIG. 5A a protective cap layer 144 is formed on the RSD regions 142. The protective cap layer 144 may be an oxide layer formed using thermal oxidation of the RSD regions 142. Alternately, the RSD regions 142 may be recessed (e.g., etched) slightly below the upper surface of the mandrel placeholder 136. Then, the recesses are refilled with protective material, e.g., by depositing an oxide or silicon nitride film, and planarized, e.g. using CMP. Next, as shown in FIG. 5B, a gate orifice 146 is formed between the RSD regions 142 to the device channel 138 by removing the mandrel placeholder 136, e.g., selectively, isotropically etching with a hot phosphoric acid. Next, as shown in FIG. 5C a sidewall spacer 148 is formed in the gate orifice 146. Preferably, the sidewall spacer 148 is formed by conformally depositing and etching a layer of spacer material, e.g., chemical vapor deposition of a SiN layer and anisotropically dry etching the SiN layer, e.g., with a RIE that is selective to the cap layer 144. In FIG. 5D a gate dielectric layer 150 is formed, preferably using atomic layer CVD (ALCVD) to deposit a 1–2.3 nm thick dielectric material layer at least on the channel 138. The gate dielectric layer 150 is $SiO_2$ or, preferably, a high-K dielectric may be any suitable high-K dielectric such as, a hafnium oxide ($HfO_x$), a zirconium oxide ($ZrO_x$), silicon oxynitride (SiON) or the like. Finally, gates 152 in FIG. 5E, preferably 20–50 nm long, are formed between the sidewall spacers 148 by plugging the gate orifice 146 with a layer of a suitable gate material. Thus, the sidewall spacer 148 and, correspondingly, the RSD regions 142, act as a horizontal mask or stopping layer for the gate layer. Preferably, the gates 152 are metal, doped silicon or SiN, which is deposited, e.g., CVD. The gate layer is planarized to the STI plugs 134, e.g., using CMP, preferably, also, removing the cap layer with excess gate material. As noted hereinabove, P-type and N-type devices may be formed in parallel, forming each feature for both device types at the same point or, sequentially, forming PFETs and then NFETs or vice versa.

Figure 6:
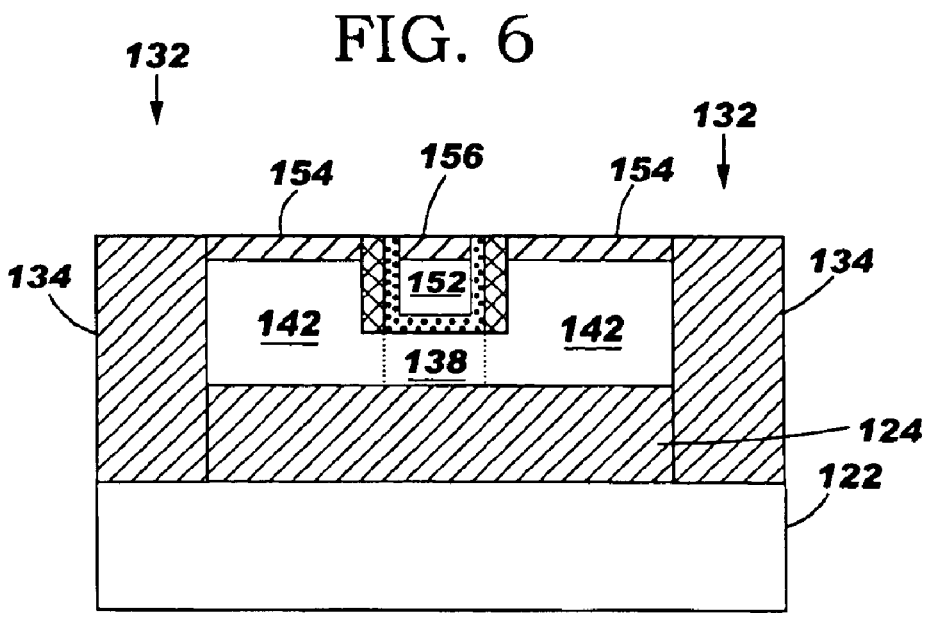
FIG. 6 shows salicide formed on RSD regions and on the gate.
Figure 7:
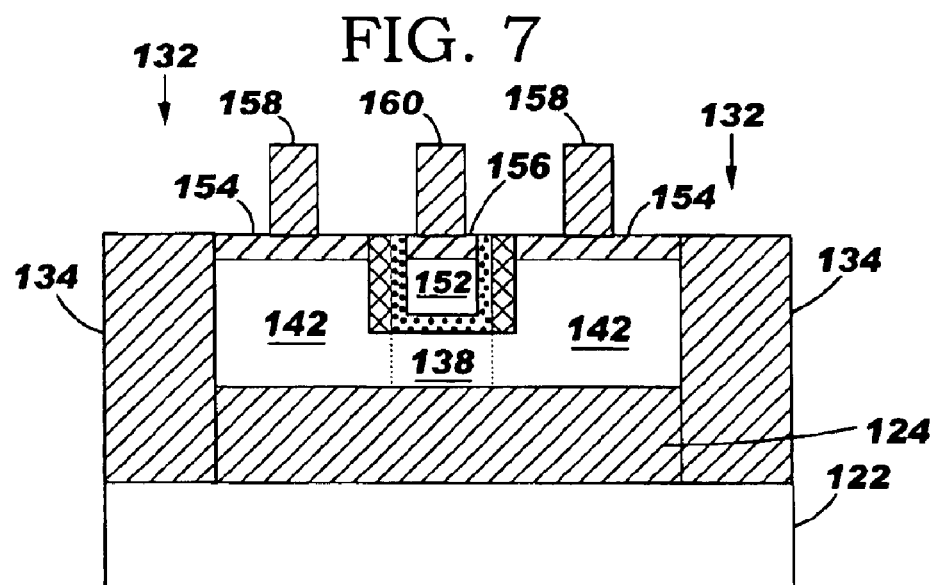
FIG. 7 shows FET interconnects to salicide regions for wiring FETs into circuits.

FIG. 6 shows the step 110 of forming salicide 154 on RSD regions 142 and, if gate material is polysilicon, coincidentally forming salicide 156 on gates 152. So, for example, a thin layer (e.g., 50–200 Å) of nickel (Ni) and titanium nitride (TiN) is deposited, thermally annealed (e.g., at 1000 C° and wet etched with a suitable etchant. Thus, having formed salicide 154, 156, ultra-thin devices have been formed with low resistance RSD regions. Step 112 begins in as shown in FIG. 7, as interconnects 158, 160 are formed to salicide regions 154, 156 between FETs, connecting circuit devices together. Thereafter, device processing continues through typical semiconductor manufacturing middle of the line (MOL) and back end of the line (BEOL) processing steps to form integrated circuit (IC) chips.

Advantageously, ultra-thin FETs formed according to the present invention have reduced device resistances, including resistances in series with the channel for high performance applications. Salicided terminals minimize the incidence of inter-terminal shorts, e.g., source to drain. Further, devices have a high-K gate dielectric formed on a state of the art SOI wafer with feature tolerance variations minimized.

While the invention has been described in terms of preferred embodiments, those skilled in the art will recognize that the invention can be practiced with modification within the spirit and scope of the appended claims.

What is claimed is:

1. A field effect transistor (FET) comprising:
   a thin channel disposed on an insulator layer;
   a pair of source/drain regions thicker than said thin channel and extending upward from said insulator layer, one of said pair of source/drain regions at each end of said thin channel;
   a gate dielectric on said thin channel;
   a gate disposed on said gate dielectric between said pair of source/drain regions, an upper surface of said gate being substantially coplanar with an upper edge of said pair of source/drain regions; and
   an isolation region at an end of each of said pair of source/drain regions extending upward from said insulator layer, said each of said pair of source/drain regions being between said gate and one said isolation region.

2. A FET as in claim 1, wherein said thin channel is 5 to 200 nm thick.

3. A FET as in claim 2, wherein said thin channel is 30 nm thick.

4. A FET as in claim 1, wherein said source/drain regions are 20 to 200 nm thicker than said channel.

5. A FET as in claim 4, wherein said source/drain regions are 50 nm thicker than said channel.

6. A FET as in claim 1, further comprising a sidewall spacer between said gate and each of said pair of source/drain regions.

7. A FET as in claim 6, wherein said gate dielectric is a high K dielectric and separates said gate from each said sidewall spacer.

8. A FET as in claim 7, wherein said gate comprises doped silicon.

9. A FET as in claim 8, further comprising a conductive material layer on each of said gate and said pair of source/drain regions.

10. A FET as in claim 9, wherein said sidewall spacer is silicon nitride (SiN) and said conductive material layer is a salicide layer.

11. A FET as in claim 1, wherein said pair of source/drain regions are composite semiconductor regions.

12. A FET as in claim 11, wherein said composite semiconductor regions include a layer of pseudomorphic material.

13. A FET as in claim 11, wherein said composite semiconductor regions include a strained silicon germanium layer.

14. A FET as in claim 1, wherein thin channel and said pair of source/drain regions are silicon and said FET is a p-type FET (PFET).

15. A FET as in claim 1, wherein thin channel and said pair of source/drain regions are silicon and said FET is a n-type FET (NFET).

16. A FET as in claim 1, wherein said FET is one of a plurality of said FETs and said insulator layer is buried oxide layer in a silicon on insulator (SOI) substrate, ones of said plurality being p-type FETs (PFETs) and remaining ones being n-type FETs (NFETs).

17. An integrated circuit (IC) on a silicon on insulator (SOI) chip, said IC including a plurality of field effect transistors (FETs) disposed on an insulating layer, ones of said plurality being p-type FETs (PFETs) and remaining ones being n-type FETs (NFET), said insulating layer being on a semiconductor substrate, each of said FETs comprising:

- a thin channel of semiconductor material disposed on an insulator layer;
- a pair of source/drain regions of said semiconductor material and thicker than said thin channel, one of said pair of source/drain regions at each end of said thin channel and extending upward from said insulator layer;
- a sidewall spacer at each of said pair of source/drain regions;
- a gate dielectric on said thin channel and extending upward along each said sidewall spacer;
- a gate disposed on said gate dielectric, each said sidewall spacer between said gate and one of said pair of source/drain regions, an upper surface of said gate being substantially coplanar with an upper edge of said pair of source/drain regions;
- a conductive material layer on an upper surface of said each of said pair of source/drain regions; and
- an isolation region at an end of said each of said pair of source/drain regions and extending upward from said insulator layer, said each of said pair of source/drain regions being between said sidewall and one said isolation region.

18. An IC as in claim 17, wherein said thin channel is 5 to 200 nm thick.

19. An IC as in claim 18, wherein said thin channel is 30 nm thick.

20. An IC as in claim 19, wherein said source/drain regions are 20 to 200 nm thicker than said channel.

21. An IC as in claim 20, wherein said pair of source/drain regions are composite semiconductor regions.

22. An IC as in claim 21, wherein said composite semiconductor regions include a layer of pseudomorphic material.

23. An IC as in claim 21, wherein said composite semiconductor regions include a strained silicon germanium layer.

24. An IC as in claim 20, wherein said source/drain regions are 50 nm thicker than said channel.

25. An IC as in claim 24, wherein said gate dielectric is a high K dielectric, said sidewall spacer is silicon nitride (SiN) and said conductive material layer is a salicide layer.

26. An IC as in claim 25, wherein said gate comprises salicide on doped silicon.

* * * * *